United States Patent
Gao

(10) Patent No.: US 11,729,949 B2
(45) Date of Patent: Aug. 15, 2023

(54) DISAGGREGATED SYSTEM ARCHITECTURE FOR IMMERSION COOLING

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 23 days.

(21) Appl. No.: 17/355,579

(22) Filed: Jun. 23, 2021

(65) Prior Publication Data

US 2022/0418146 A1    Dec. 29, 2022

(51) Int. Cl.
    H05K 7/20    (2006.01)

(52) U.S. Cl.
    CPC ......... *H05K 7/203* (2013.01); *H05K 7/20309* (2013.01); *H05K 7/20318* (2013.01); *H05K 7/20327* (2013.01); *H05K 7/20809* (2013.01)

(58) Field of Classification Search
    CPC .............. H05K 7/203; H05K 7/20318; H05K 7/20818; H05K 7/20781; H05K 7/2079; H05K 7/20236; H05K 7/20836; H05K 7/20309; H05K 7/20327; H05K 7/20272; H05K 7/20145; H05K 7/20281; H05K 7/20663; H05K 7/208; H05K 5/067; H05K 7/1497; H05K 7/2029; H05K 7/20718; G06F 2200/201; G06F 1/20; G06F 1/181; F28D 15/0266; F28D 15/02
    USPC ...................... 361/679.53, 699, 679.46, 700; 165/104.33, 104.21, 104.19, 301
    See application file for complete search history.

(56) References Cited

U.S. PATENT DOCUMENTS

| | | | | |
|---|---|---|---|---|
| 1,512,263 A * | 10/1924 | Amend | ..................... | C10G 9/24 196/121 |
| 3,586,101 A * | 6/1971 | Chu | ....................... | F25B 23/006 174/15.1 |
| 3,763,663 A * | 10/1973 | Schlichtig | ............... | F25B 27/00 62/498 |
| 2007/0193285 A1* | 8/2007 | Knight | .................. | G01M 3/228 62/149 |
| 2009/0260777 A1* | 10/2009 | Attlesey | ................ | H01L 23/473 165/104.33 |
| 2014/0218861 A1* | 8/2014 | Shelnutt | ............. | H05K 7/20818 361/679.53 |
| 2014/0307384 A1* | 10/2014 | Best | ...................... | H05K 7/1497 361/679.53 |
| 2015/0060009 A1* | 3/2015 | Shelnutt | ................. | H05K 7/203 165/11.1 |

(Continued)

*Primary Examiner* — Mandeep S Buttar
(74) *Attorney, Agent, or Firm* — Womble Bond Dickinson (US) LLP

(57) ABSTRACT

In one embodiment, a cooling system comprises an information technology (IT) cluster layer with multiple immersion tanks, each immersion tanks including electronic components submerged in a two-phase liquid coolant; and a cooling capacity layer that includes a vapor subsystem, a liquid subsystem, and a condensing cooler. The system further includes a distribution layer that include vapor lines for transmitting vapor from each of the immersion tanks to the vapor subsystem, and liquid lines for distributing liquid from the liquid subsystem to each immersion tank in the IT cluster layer. The two subsystems operate independently to maintain proper fluid level in the immersion tanks efficiently.

20 Claims, 6 Drawing Sheets

(56) References Cited

U.S. PATENT DOCUMENTS

| | | | |
|---|---|---|---|
| 2015/0233053 A1* | 8/2015 | Stromberg | D21C 7/08 |
| | | | 162/247 |
| 2017/0177041 A1* | 6/2017 | Shelnutt | H05K 7/20809 |
| 2019/0357379 A1* | 11/2019 | Kolar | H05K 7/20827 |
| 2021/0059079 A1* | 2/2021 | Keehn | H05K 7/20327 |
| 2022/0100241 A1* | 3/2022 | Alissa | H05K 7/20318 |
| 2022/0110223 A1* | 4/2022 | Heydari | H05K 7/20772 |
| 2022/0151097 A1* | 5/2022 | McManis | H05K 7/20781 |
| 2022/0408602 A1* | 12/2022 | Gao | G06F 1/206 |

* cited by examiner

DISAGGREGATED SYSTEM ARCHITECTURE FOR IMMERSION COOLING

FIELD OF THE INVENTION

Embodiments of the present disclosure relate generally to cooling systems. More particularly, embodiments of the disclosure relate to a disaggregated immersion cooling system.

BACKGROUND

An efficient thermal management solution can reduce cooling cost for electronics in a data center. For a thermal management solution to be efficient, it should satisfy the data center power consumption at all time with a minimum cooling capacity buffer, can be self-regulating with the change of the power consumption in the data center, can have a hardware design that is flexible enough to accommodate the ever changing IT requirements, and can support a phase change cooling system.

Immersion cooling has been widely used as a cooling method by which IT components and other electronics, including complete servers, are submerged in a thermally conductive dielectric liquid or coolant. Heat is removed from the IT components or other electronics by circulating liquid into direct contact with the hot IT components or servers, then through cool heat exchangers.

However, existing cooling systems using immersion cooling typically include too large a cooling buffer that may never be used during the whole lifetime of the data centers and servers, resulting a waste of cooling capacity. Further, existing cooling systems are not easily expandable to accommodate different heat load requirements, or are not fully self-regulating at the system level.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
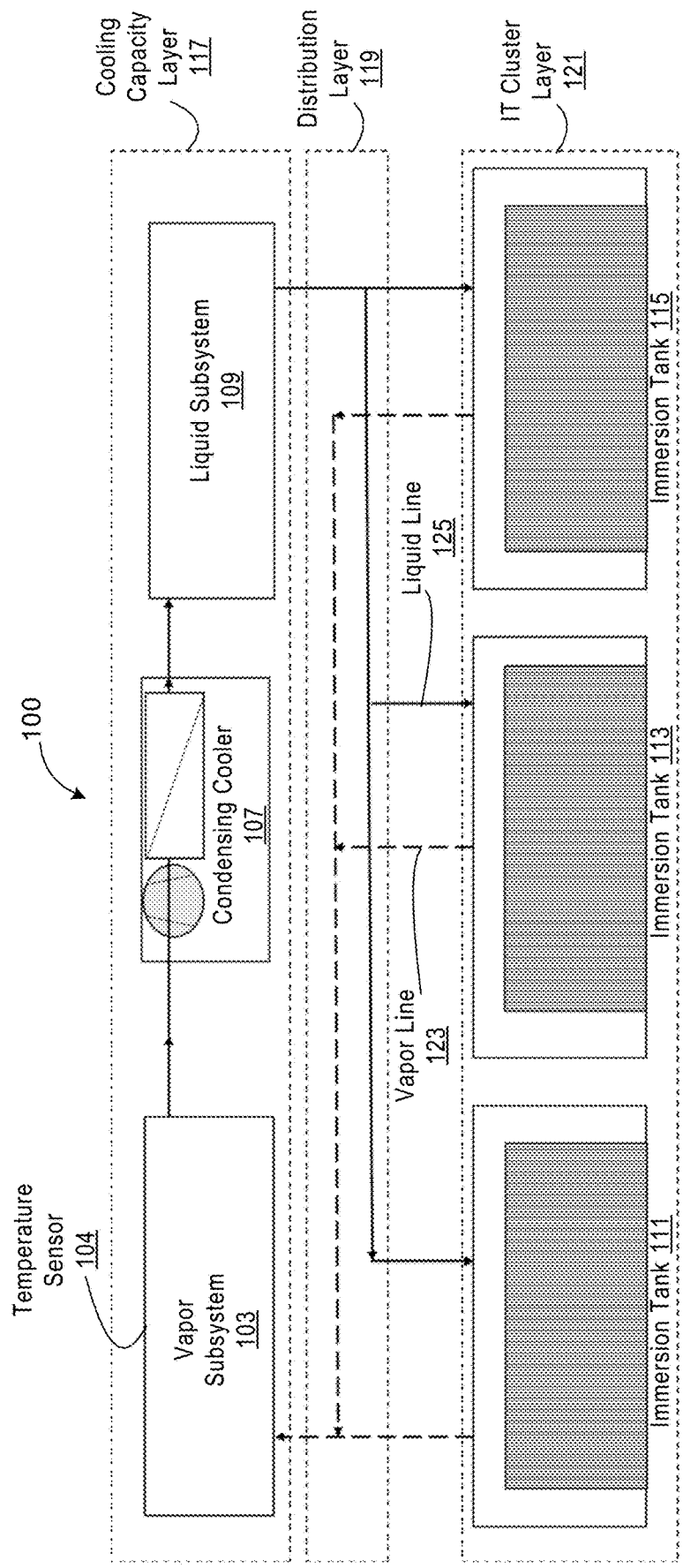
FIG. 1 shows an immersion cooling system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiments, described herein is a system architecture and design method for disaggregating vapor storage and liquid distribution in an immersion cooling system to efficiently handle dynamic variations in power and heat loads. A three-layer architecture is described. The first layer is the IT cluster layer, including various immersion tanks with electronic components submerged at least partially in a two-phase liquid coolant. The second layer is the distribution layer. The third layer is a cooling capacity layer that includes a vapor subsystem, a condenser, and a liquid subsystem. The distribution layer connects the IT cluster layer and the cooling capacity layer.

In one embodiment, the vapor subsystem and the liquid subsystem are disaggregated, meaning that vapor from the immersion tanks is not to be condensed to liquid instantaneously, but instead is stored in the vapor subsystem to create a vapor buffer for variations in heat loads and power. A condensing cooler with a compressor is used to connect the vapor subsystem and the liquid subsystem.

In one embodiment, each immersion tank includes a vapor line connected to the vapor subsystem, and one or more liquid lines connected to the liquid subsystem. A liquid return port on an immersion tank can be expanded for connecting with additional liquid sources. The distribution layer utilizes the vapor lines and liquid lines to transmit vapor from the immersion tanks to the vapor subsystem, and to distribute liquid from the liquid subsystem to the immersion tanks. The liquid lines can be regulated by fluid level sensors within the immersion tanks to adjust fluid flowing volumes from the liquid subsystem to the immersion tanks. Further, each immersion tank may include a fluid pump to facilitate the liquid flow, particularly when the liquid is needed when the fluid level within the immersion tank is lower due to the high vapor generation rate, as an example.

In one embodiment, a cooling system comprises an information technology (IT) cluster layer with multiple immersion tanks, each immersion tanks including electronic components (e.g., processors, memory, storage devices, etc.) submerged in a two-phase liquid coolant; and a cooling capacity layer that includes a vapor subsystem, a liquid subsystem, and a condensing cooler. The system further includes a distribution layer that include vapor lines for transmitting vapor from each of the immersion tanks to the vapor subsystem, and liquid lines for distributing liquid from the liquid subsystem to each immersion tank in the IT cluster layer, wherein the first vapor subsystem and the first liquid subsystem operate independently to provide sufficient cooling to the immersion tanks.

In one embodiment, each immersion tank includes a fluid level sensor for measuring a level of liquid coolant in the immersion tank. A fluid pump is positioned inside the immersion tank or outside the immersion tank. The first vapor subsystem is to release vapor to the condensing cooler when an ambient temperature as measured by a temperature sensor is below a threshold.

In one embodiment, the cooling capacity layer further includes a second liquid subsystem, which is to distribute liquid to at least one of the immersion tanks via an expansion port on the immersion tank, and to distribute liquid to the first vapor subsystem.

In one embodiment, the first IT cluster layer further includes additional immersion tank, wherein the additional immersion tank is to receive liquid from the first liquid subsystem and the second liquid subsystem via an expansion port on the additional immersion tank.

In one embodiment, the cooling capacity layer further includes a second vapor subsystem and a second liquid subsystem. The second vapor subsystem is to receive vapor from immersion tanks in a second IT cluster layer, and to release vapor to the condensing cooler. The second liquid subsystem is to receive liquid from the condensing cooler for distributing to each of immersion tank in the second IT cluster layer via a second distribution layer.

In one embodiment, each of the first vapor subsystem and the second vapor subsystem includes a vapor container and a pressure sensor, wherein each of the first liquid subsystem and the second liquid subsystem includes a liquid container and a fluid level sensor. The first liquid subsystem and the second liquid subsystem are interconnected with each other such that liquid directly flows between the two liquid subsystems.

In one embodiment, the condensing cooler is triggered or activated to operate when an ambient temperature measured by the temperature sensor is lower than a designated threshold, the first vapor subsystem is filled with vapor up to a certain level as measured by the pressure sensor, and/or the liquid subsystem has a lower fluid level than a threshold as measured by the fluid level sensor.

In one embodiment, the cooling capacity layer and the first distribution layer function in conjunction to manage vapor flows and liquid flows to maintain a proper fluid level in each of the plurality of immersions tanks.

The embodiments described above are not exhaustive of all aspects of the present invention. It is contemplated that the invention includes all embodiments that can be practiced from all suitable combinations of the various embodiments summarized above, and also those disclosed in the Detailed Description below.

The various architecture designs in various embodiments of the disclosure provide a fully self-regulating immersion cooling system that has a proper size of vapor buffer to accommodate heat load variations. The system is highly efficient in phase change management and power management, and therefore can satisfy constantly increasing power density in a IT cluster, to accommodate dynamic environment variations, and to efficiently balance the mismatch between the heat load and cooling capacity.

FIG. 1 shows an immersion cooling system 100 according to one embodiment. The immersion cooling system 100 includes three layers: an IT cluster layer 121, a distribution layer 119, and a cooling capacity layer 117. The IT cluster layer 121 includes multiple immersion tanks 111, 113, and 115, each of which includes electronic components (e.g., servers) that are at least partially submerged into a two-phrase immersion liquid coolant. Examples of the two-phrase immersion liquid coolant include dielectric heat transfer liquid, and water or oil. When the electronic components generate heat to cause the immersion liquid coolant to reach its boiling point, the immersion liquid coolant boils and transforms into vapor.

As shown in FIG. 1, a vapor subsystem 103 and a liquid subsystem 109 in the cooling capacity layer 117 are shared by the immersion tanks 111, 113 and 115. The vapor subsystem 103 includes a vapor container that can be used to store and buffer vapor generated from each of the immersion tanks 111, 113, and 115. The liquid subsystem 109 includes a liquid container that can be to store and buffer liquid for distribution to each of the immersion tanks 111, 113 and 115.

As shown in FIG. 1, the vapor subsystem 103 and the liquid subsystem 109, which are positioned outside and above the immersion tanks 111, 113 and 115, can be fully disaggregated. As used herein, being disaggregated means that vapor stored into the vapor subsystem 103 is not instantaneously condensed into liquid to be stored in the liquid subsystem 109. Instead, the vapor subsystem 103 functions a buffer for the vapor, which is be condensed into liquid to be distributed to each of the immersion tanks 111, 113 and 115 when the liquid level in one or more immersion tanks fall bellows a particular level. The vapor subsystem 103 may release the vapor to condensing cooler 107 in response to determining that the vapor pressure within the vapor subsystem 103 exceeds a predetermined pressure threshold.

The immersion cooling system 100 needs to maintain sufficient immersion liquid coolant to at least partially submerge electronic components in the immersion tank. For example, a particular range can be specified for the immersion coolant in each immersion tanks. If the level of immersion coolant in an immersion falls out of the range, more liquid needs to be distributed from the liquid subsystem 109. Thus, the immersion cooling system 100 can release more vapor into a condensing cooler 107, which can include a compressor for facilitating the condensing of vapor into liquid.

In one embodiment, the fluid levels in the immersions tanks 111, 113, and 115 are not the only indicators that may trigger the liquid distribution from the liquid subsystem 109. The ambient temperature may also be considered. In one embodiment, the liquid level sensor may be adjusted to different threshold for different IT units since different IT unit may require different immersion fluid level.

In one embodiment, even if there is a need to release vapor to the condensing cooler 107 based on fluid levels in the immersion tanks 111, 113, and 115, the immersion cooling system 100 does not immediately release the vapor. Instead, the immersion cooling system 100 can take advantage of the ambient temperature variations to increase the vapor-to-liquid conversion efficiency.

Thus, when there is a need to release vapor to the condensing cooler 107, the immersion cooling system 100 may wait until the ambient temperature as measured by a temperature sensor 104 falls below a threshold, and then release vapor to the condensing cooler 107. When the ambient temperature is low, the atmosphere tends to have more cooling capacity, thereby increasing the efficiency of the condensing cooler 107. When the ambient temperature is high, e.g., above a preset threshold, the immersion cooling system 100 would not release vapor to the condensing cooler 107, even if there is a need to do so due to the low fluid level (i.e. liquid coolant level) in one of the immersion tanks. In such a case, the immersion cooling system 100 can rely on existing liquid coolant in the liquid subsystem 109 to make up the low fluid level in one or more immersion tanks. Alternatively, when the vapor pressure within the vapor subsystem 103 reaches a certain level, which is measured by a pressure sensor within the vapor subsystem 103 (not shown), the vapor may be released to condensing cooler 107. Similarly, when the liquid level within the liquid subsystem 109 drops below a certain level, which may be measured by a liquid level sensor within the liquid subsystem 109, the condensing cooler 107 is activated to receive vapor from the vapor subsystem 103, condense the vapor into liquid, and transmit the liquid to liquid subsystem 109 to be stored therein. The cooling capacity layer 117 is configured to ensure that the vapor pressure within the vapor subsystem is maintained at a safety level and/or a liquid level of liquid subsystem 109 is maintained at a sufficient level.

The distribution layer 119 between the cooling capacity layer 117 and the IT cluster layer 121 includes vapor lines (e.g., vapor line 123) and liquid lines (e.g., liquid line 125). The vapor lines can be configured to connect the vapor subsystem 103 to each immersions tank, and the liquid lines can be configured to connect the liquid subsystem 109 to each immersion tank. In one embodiment, this layer may include customized lines such as lines with different diameters for assisting the vapor transportation.

Figure 2:
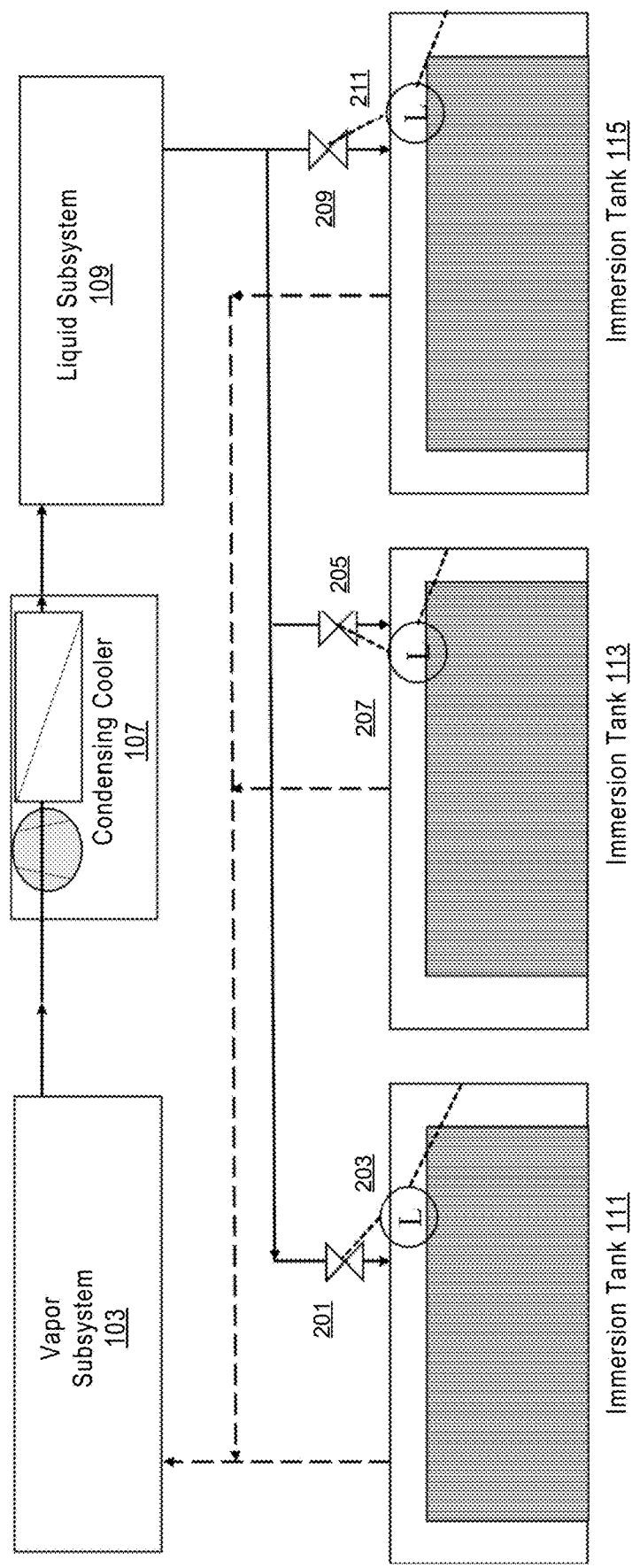
FIG. 2 further illustrates the immersion cooling system according to one embodiment.

FIG. 2 further illustrates the immersion cooling system 100 according to one embodiment. More specifically, FIG. 2 illustrates how the liquid supply to each immersion tank is controlled and regulated. As shown in FIG. 2, the fluid level sensors 203, 207 and 211 can be used to measure the fluid level in each immersion tank, and the control valves 201, 205 and 209 can be used to regulate the liquid distributed into each immersion tank from the liquid subsystem 109 to ensure a proper fluid level in each immersion tank. In one embodiment, variations in open ratios of the valves 201, 205 and 209 can be adjusted to change volume flow rates of liquid delivered to the tanks. The distribution layer 119 independently operates to ensure each of the immersion tanks 111, 113, and 115 to maintain proper level of coolant therein, using the liquid supplied by liquid subsystem 109, while the cooling capacity level operates independently to maintain the proper liquid level in the liquid subsystem 109.

Figure 3:
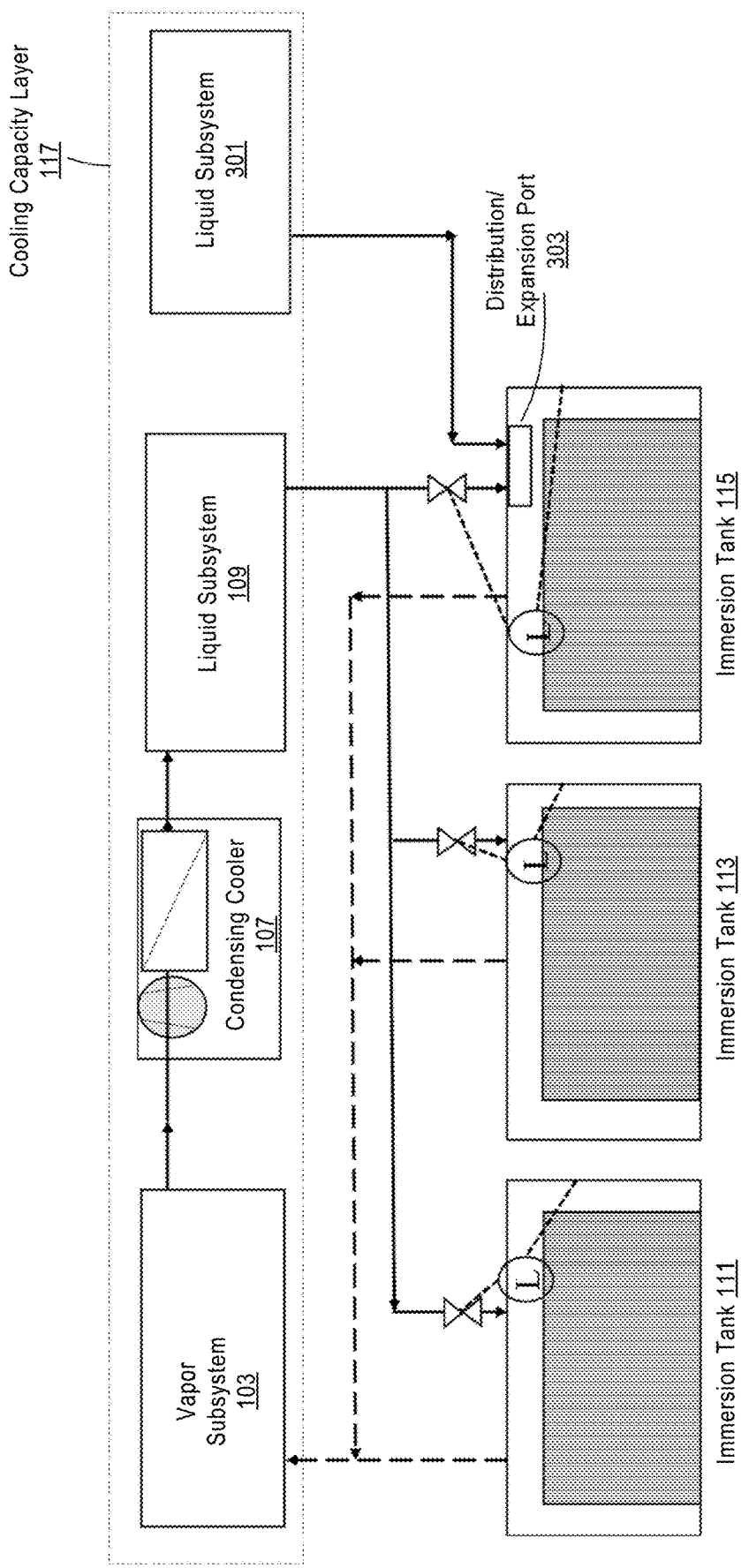
FIG. 3 further illustrates the immersion cooling system according to one embodiment.

FIG. 3 further illustrates the immersion cooling system 100 according to one embodiment. More specifically, FIG. 3 shows that the immersion cooling system 100 can be expanded to include one or more additional liquid subsystems. In the embodiment as shown in FIG. 3, a liquid subsystem 301 can be installed in the cooling capacity layer 117 and can be connected to the immersion tank 115 through a distribution/expansion port 303.

This embodiment illustrates a scenario where the immersion tank 115 has been upgraded to include a high power density electronic system, which may require additional cooling capacity for a short period of time. The additional liquid subsystem 301 can provide the additional cooling capacity if needed by distributing additional cooling liquid to the immersion tank 115 to maintain the level of immersion coolant within a preset range. As shown in FIG. 3, the immersion tanks can receive liquid from the liquid subsystem 109 and 301. The liquid subsystem 301 can be understood as a cooling capacity extension subsystem. This expansion port can be designed as a module added to the immersion tank.

Figure 4:
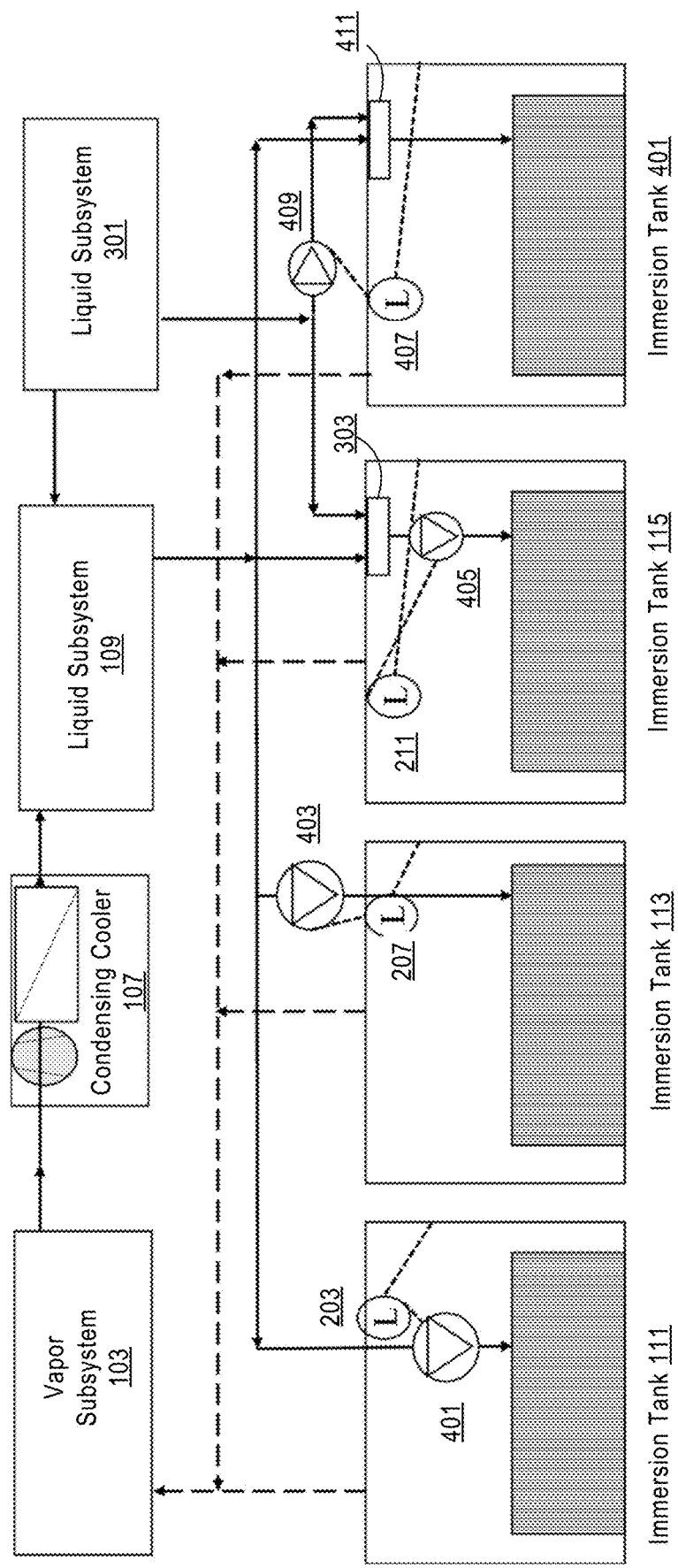
FIG. 4 further illustrates the immersion cooling system according to one embodiment.

FIG. 4 further illustrates the immersion cooling system 100 according to one embodiment. As shown in FIG. 4, the liquid subsystem 301 can be used to expand the existing liquid system (including the vapor subsystem 103, the condensing cooler 107, and the liquid subsystem 109), and to enable an individual immersion tank 401 to be added.

In this embodiment, liquid coolant from the liquid subsystem 301 can be distributed to the liquid subsystem 109, and distributed to the immersion tank 115 via the expansion port 303 and to the added immersion tank 401 via an expansion port 411.

As shown, each of the immersion tanks 111, 113, 115, and 401 is equipped with one of liquid pumps 401, 403, 405, and 409. Each liquid pump is controlled by a fluid level sensor within the immersion tank used to measure the fluid level in the immersion tank.

In one embodiment, the pumps 401, 403, 405, and 409 may be needed to make sure that the liquid coolant in the one or more liquid subsystems can be distributed in a timely manner to the immersion tanks 111, 113, 115, and 401. This is particularly true when the distribution lines are long such that the liquid coolant has to travel a long distance before reaching the immersion tanks, and/or when the liquid coolant has a high viscosity.

The fluid level sensors 203, 207 and 211, as described above, can be used to measure the fluid level in the immersion tank 111, the immersion tank 113, and the immersion tank 115. A fluid level sensor 407 can be used to measure the fluid level in the immersion tank 401. When the fluid level in an immersion tank falls below a preset level, the fluid level sensor in the immersion tank can trigger the associated fluid pump configured for the immersion tank to draw additional liquid coolant into the immersion tank such that a proper level of liquid coolant can be maintained in the immersion tank to submerge electronic components in the immersion tank.

Each fluid pump can be disposed within an immersion tank; for example, the fluid pumps 401 and 405 are within the immersion tanks 111 and 115 respectively. Each fluid pump can also be disposed outside an immersion tank and directly connected to distribution lines; for example, the fluid pumps 403 and 409 are integrated into the distribution lines. The fluid pump 409 can draw liquid coolant from the liquid subsystem 301 to both the immersion tank 115 and the immersion tank 401.

As such, the various embodiments of the disclosure the current architecture enables the adding of cooling expansion, including the cooling fluid, cooling fluid port, as well as additional fluid pump such as 409.

Figure 5:
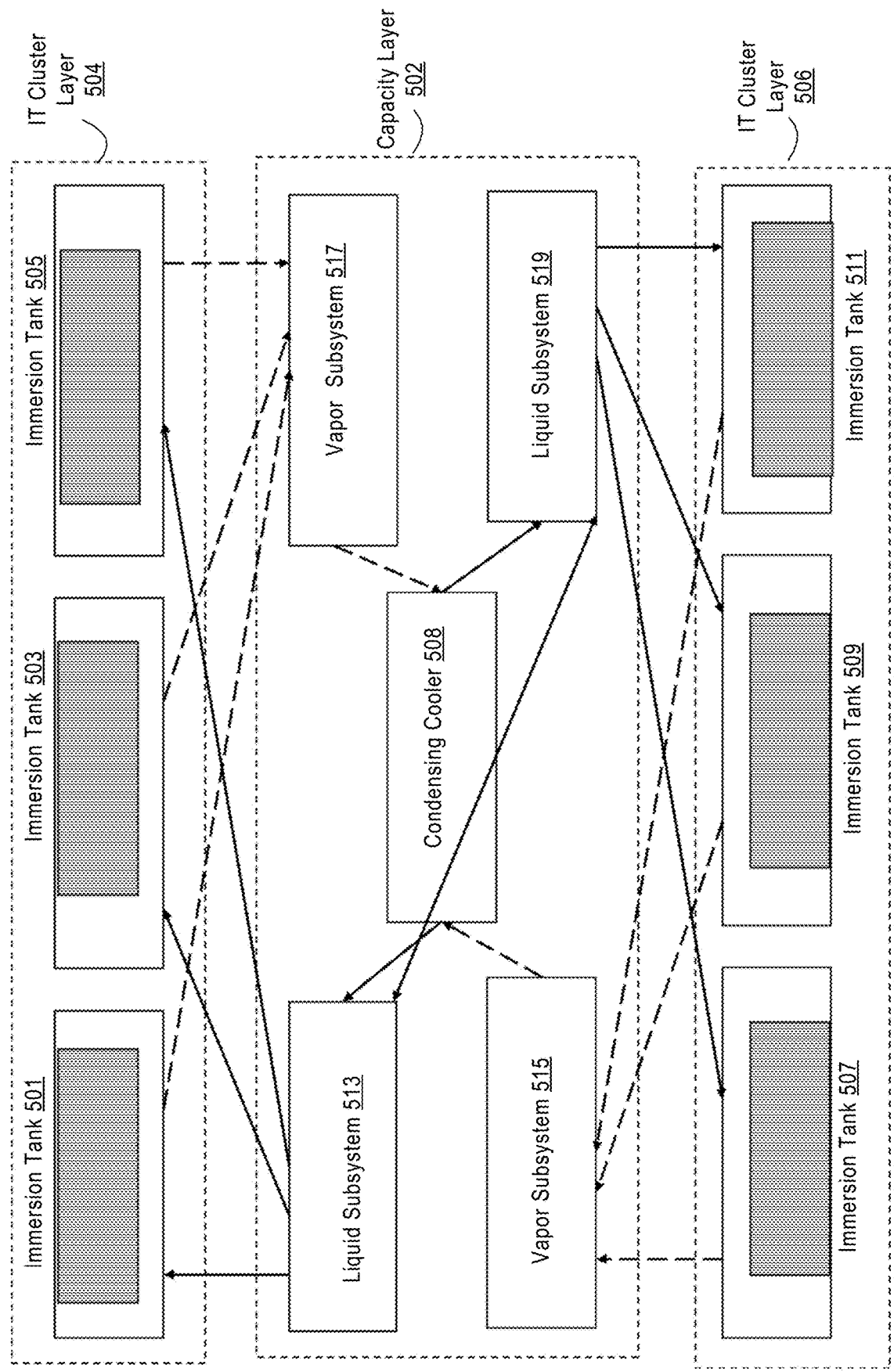
FIG. 5 shows that multiple IT clusters can share one condensing cooler according to one embodiment.

FIG. 5 shows that multiple IT clusters can share one condensing cooler according to one embodiment. In FIG. 5, two IT clusters are used to illustrate the sharing of a condensing cooler 508 by multiple IT clusters. In different implementations, more IT clusters/cluster layers can share the condensing cooler 508.

As shown, a first IT cluster in a first IT cluster layer 504 includes immersion tanks 501, 503, and 505, and the second IT cluster in a second IT cluster layer 506 includes immersion tanks 507, 509, and 511. Each of the IT cluster layers 504 and 506 is the same as the IT cluster layer 121 described in FIG. 1. Each immersion tank in the IT cluster layers 504 and 506 can be same as one of the immersion tanks 111, 113, and 115 shown in FIG. 1; and is similarly connected to one of the liquid subsystems 513 and 519, and to one of the vapor subsystems 517 and 515 via a distribution layer (not shown in FIG. 5).

However, in FIG. 5, a capacity layer 502 is shared by the two IT cluster layers 504 and 506, where the condensing cooler 508 can receive vapor from both the vapor subsystem 517 and the vapor subsystem 515, and distribute the liquid condensed from the received vapor to both the liquid subsystem 513 and the liquid subsystem 519. Further, the two liquid subsystem 513 and 519 are connected, and thus liquid from each liquid subsystem can be shared with the other.

The above configuration would allow the capacity layer 502 to buffer more vapor because the vapor to be buffered are from a larger number of immersion tanks. The additional buffered vapor enables the capacity layer 502 to take a better advantage of temperature variations of the atmosphere.

Figure 6:
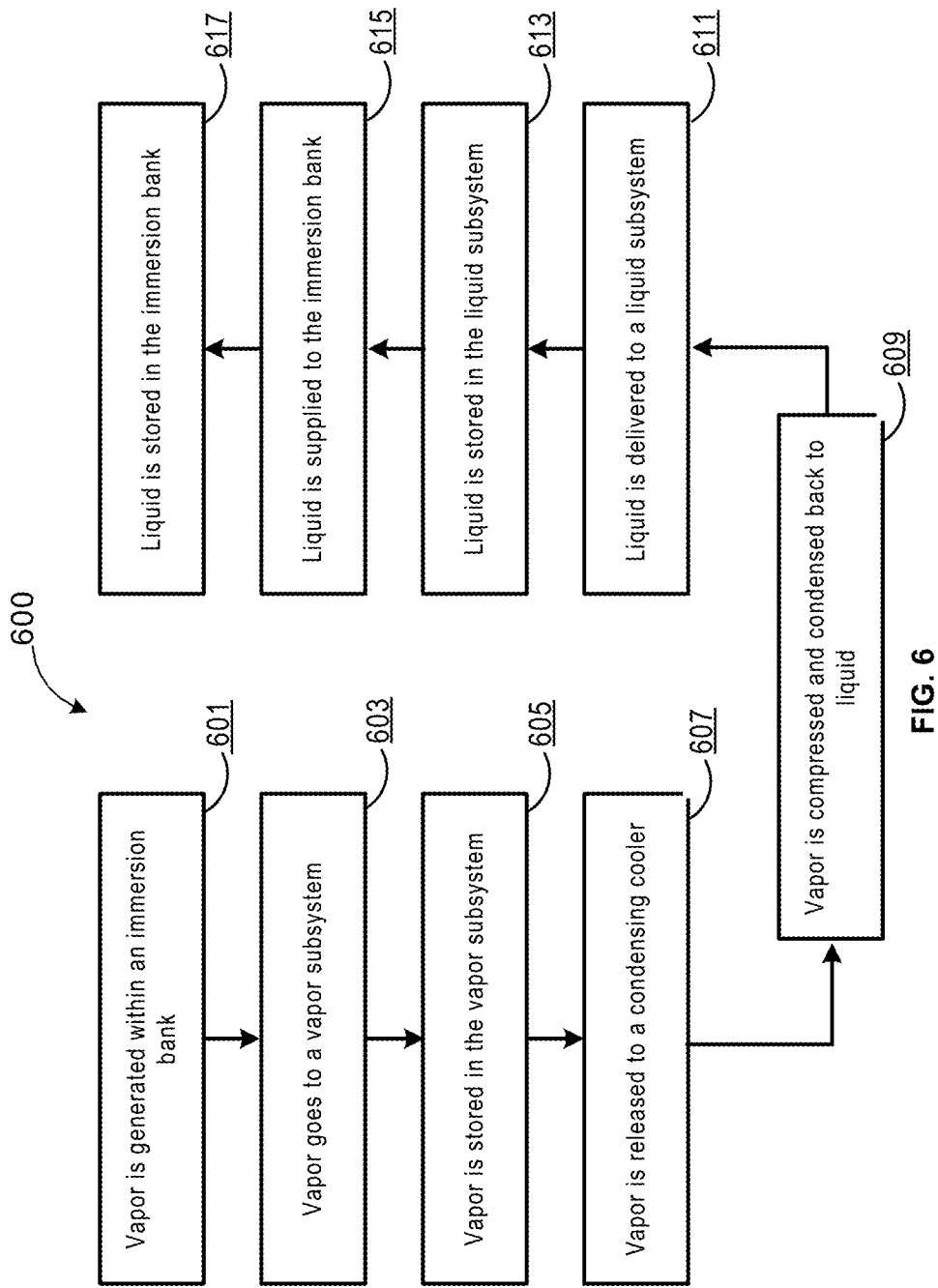
FIG. 6 is a flow diagram illustrating an asynchronous process in the immersion cooling system.

FIG. 6 is a flow diagram illustrating an asynchronous process in the immersion cooling system. As shown, the vapor generation and condensing, and the liquid supply and return are completely separated. Through the asynchronous process, the immersion cooling system ensures a proper thermal environment within each individual immersion tank, and can efficiently adjust the condensing process based on heat load variations, power variations, and other system or environmental variations. Through the asynchronous process, the immersion cooling system can also have non-perceived operations to accommodate the above variations.

At block 601, vapor is generated within each of many immersion tanks due to the heating of electronic components submerged in a two-phase change coolant. At block 603, the vapor is elevated to a vapor container in a vapor subsystem and is stored in the vapor subsystem as shown by block 605. At block 607, the vapor stored in the vapor subsystem is not immediately released to a condensing cooler, but rather is to be released based on fluid levels in one or more immersion tanks as measured by fluid level sensors. This delayed vapor release can create a buffer of vapor for accommodating variations in heat loads, power, and other internal and external factors. At block 609, the condensing cooler compresses and condenses the vapor to liquid, and delivers the liquid to a liquid subsystem with a liquid container (block 611). At block 613, the liquid is stored in the liquid subsystem. At block 615, liquid is distributed from the liquid subsystem to the immersion tanks, and is stored there for cooling the electronic components in the immersion tanks. It needs to be mentioned that the blocks 601-607 and blocks 617-611 can be operated in an asynchronous manner.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

What is claimed is:

1. An immersion cooling system, comprising:
   an information technology (IT) cluster layer that includes a plurality of immersion tanks, wherein each of the plurality of immersion tanks includes electronic components submerged in a two-phase liquid coolant;
   a cooling capacity layer that includes a vapor subsystem, a liquid subsystem, and a condensing cooler coupled between the vapor subsystem and the liquid subsystem, wherein the liquid subsystem is a first liquid subsystem, wherein the cooling capacity layer further includes a second liquid subsystem to distribute liquid to at least one immersion tank of the plurality of immersion tanks via an expansion port on each of the at least one immersion tank; and
   a distribution layer that include vapor lines for transmitting vapor from each of the plurality of immersion tanks to the vapor subsystem, and liquid lines for distributing liquid from the liquid subsystem to each of the plurality of immersion tanks in the IT cluster layer, wherein the vapor subsystem and the liquid subsystem operate independently to provide sufficient cooling to the immersion tanks.

2. The system of claim 1, wherein each immersion tank of the plurality of immersion tanks includes a fluid level sensor for measuring a fluid level of liquid coolant in the immersion tank.

3. The system of claim 2, wherein each immersion tank of the plurality of immersion tanks is associated with a fluid pump disposed either inside or outside of the immersion tank to distribute the liquid from the liquid subsystem based on the fluid level of the liquid coolant in the immersion tank.

4. The system of claim 1, wherein the vapor subsystem is to release vapor to the condensing cooler when an ambient temperature as measured by a temperature sensor is below a predetermined temperature threshold or a vapor pressure within the vapor subsystem is above a predetermined pressure threshold.

5. The system of claim 1, wherein the second liquid subsystem is further to distribute liquid to the first liquid subsystem.

6. The system of claim 1, wherein the IT cluster layer further includes an additional immersion tank, wherein the additional immersion tank is to receive liquid from the first liquid subsystem and the second liquid subsystem via an expansion port on the additional immersion tank.

7. The system of claim 1, wherein the condensing cooler is triggered to operate in response to determining that an ambient temperature is lower than a predetermined temperature threshold, a vapor pressure of the vapor subsystem is above a predetermined pressure level threshold, or a liquid level within the liquid subsystem drops below a predetermined liquid level threshold.

8. The system of claim 1, wherein the cooling capacity layer and the distribution layer function in conjunction to manage vapor flows and liquid flows to maintain a proper fluid level in each of the plurality of immersion tanks.

9. The system of claim 1, wherein the vapor subsystem includes a vapor container to buffer the vapor received from the immersion tanks before transmitting the vapor to the condensing cooler.

10. The system of claim 1, wherein the liquid subsystem includes a liquid container containing fluid functions as a coolant buffer to the immersion tanks.

11. An immersion cooling data center, comprising:
    a first information technology (IT) cluster layer that includes a first set of immersion tanks, wherein each of the first set of immersion tanks includes electronic components submerged in a two-phase liquid coolant;
    a second information technology (IT) cluster layer that includes a second set of immersion tanks, wherein each of the second set of immersion tanks includes electronic components submerged in a two-phase liquid coolant;

a cooling capacity layer that includes a first vapor subsystem, a first liquid subsystem, a second vapor subsystem, a second liquid subsystem, and a condensing cooler coupled to the first and second vapor subsystems and the first and second liquid subsystems;

a first distribution layer that include vapor lines for transmitting vapor from each of the first set of immersion tanks to the first vapor subsystem and liquid lines for distributing liquid from the first liquid subsystem to each of the first set of immersion tanks in the first IT cluster layer; and a second distribution layer that include vapor lines for transmitting vapor from each of the second set of immersion tanks to the second vapor subsystem and liquid lines for distributing liquid from the second liquid subsystem to each of the second set of immersion tanks in the second IT cluster layer.

12. The data center of claim 11, wherein the condensing cooler is coupled between the first vapor subsystem and the first liquid subsystem, and wherein the condensing cooler is coupled between the second vapor subsystem and the second liquid subsystem.

13. The data center of claim 12, wherein the condensing cooler is configured to operate in response to determining that an ambient temperature is lower than a predetermined temperature threshold.

14. The data center of claim 12, wherein the condensing cooler is configured to operate in response to determining that a vapor pressure of any of the first and second vapor subsystems is above a predetermined pressure level threshold, or a liquid level within any of the first and second liquid subsystems drops below a predetermined liquid level threshold.

15. The data center of claim 11, wherein the first liquid subsystem is fluidly coupled to the second liquid subsystem.

16. The data center of claim 11, wherein each immersion tank of the immersion tanks in the first and second IT cluster layers includes a fluid level sensor for measuring a level of liquid coolant in the immersion tank.

17. The data center of claim 16, wherein the first liquid subsystem is configured to maintain a liquid level in each immersion tank of the first set of immersion tanks based on the level of liquid coolant of the immersion tank, and wherein the second liquid subsystem is configured to maintain a liquid level in each of the second set of immersion tanks based on the level of liquid coolant of the immersion tank.

18. The data center of claim 11, wherein the first vapor subsystem and the second vapor subsystem operate independently, including independently buffering the vapor received from the respective immersion tanks prior to transmitting the vapor to the condensing cooler.

19. The data center of claim 11, wherein the first liquid subsystem and the second liquid subsystem operate independently, including independently buffer the liquid received from the condensing cooler prior to supply the liquid to the respective immersion tanks.

20. The system of claim 1, wherein each of the vapor subsystem, the first liquid subsystem, and the condensing cooler is positioned vertically above each of the plurality of immersion tanks in the IT cluster layer.

* * * * *